(12) United States Patent
Cordero et al.

(10) Patent No.: US 9,230,687 B2
(45) Date of Patent: Jan. 5, 2016

(54) IMPLEMENTING ECC REDUNDANCY USING RECONFIGURABLE LOGIC BLOCKS

(71) Applicant: International Business Machines Corporation, Armonk, NY (US)

(72) Inventors: Edgar R. Cordero, Round Rock, TX (US); Timothy J. Dell, Colchester, VT (US); Joab D. Henderson, Pflugerville, TX (US); Jeffrey A. Sabrowski, Leander, TX (US); Anuwat Saetow, Austin, TX (US); Saravanan Sethuraman, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 220 days.

(21) Appl. No.: 13/867,207

(22) Filed: Apr. 22, 2013

(65) Prior Publication Data

US 2014/0317473 A1    Oct. 23, 2014

(51) Int. Cl.

| | |
|---|---|
| *G11C 29/00* | (2006.01) |
| *G11C 29/44* | (2006.01) |
| *G11C 29/42* | (2006.01) |
| *G06F 11/10* | (2006.01) |
| *G11C 29/04* | (2006.01) |

(52) U.S. Cl.
CPC ........ *G11C 29/4401* (2013.01); *G06F 11/1048* (2013.01); *G11C 29/42* (2013.01); *G11C 29/702* (2013.01); *G11C 2029/0411* (2013.01); *G11C 2029/4402* (2013.01)

(58) Field of Classification Search
CPC ............ G06F 11/1068; G06F 11/1072; G06F 11/1008; G06F 11/1076; G11C 29/00
USPC ......................................................... 714/773
See application file for complete search history.

(56) References Cited

U.S. PATENT DOCUMENTS

| | | |
|---|---|---|
| 4,412,281 A | 10/1983 | Works |
| 5,925,144 A | 7/1999 | Sebaa |
| 6,397,357 B1 | 5/2002 | Cooper |
| 7,020,811 B2 | 3/2006 | Byrd |
| 7,644,327 B2 | 1/2010 | Cohn et al. |
| 7,814,382 B2 * | 10/2010 | Sutardja et al. ............... 714/723 |
| 2001/0042230 A1 | 11/2001 | Williams et al. |
| 2006/0248411 A1 * | 11/2006 | Kirscht .................. 714/704 |
| 2010/0005366 A1 * | 1/2010 | Dell et al. ................ 714/758 |

\* cited by examiner

*Primary Examiner* — Albert Decady
*Assistant Examiner* — Enam Ahmed
(74) *Attorney, Agent, or Firm* — Joan Pennington

(57) ABSTRACT

A method, system and computer program product are provided for implementing ECC (Error Correction Codes) redundancy using reconfigurable logic blocks in a computer system. When a fail is detected when reading from memory, it is determined if the incorrect data is in the data or the ECC component of the data. When incorrect data is found in the ECC component of the data, and an actionable threshold is not reached, a predetermined Reliability, Availability, and Serviceability (RAS) action is taken. When the actionable threshold is reached with incorrect data identified in the ECC component of the data, an analysis process is performed to determine if the ECC logic is faulty. When a fail in the ECC logic is detected, the identified ECC failed logic is replaced with a spare block of logic.

18 Claims, 7 Drawing Sheets even further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

IMPLEMENTING ECC REDUNDANCY USING RECONFIGURABLE LOGIC BLOCKS

FIELD OF THE INVENTION

The present invention relates generally to the data processing field, and more particularly, relates to a method, system and computer program product for implementing ECC (Error Correction Codes) redundancy using reconfigurable logic blocks in a computer system.

DESCRIPTION OF THE RELATED ART

ECC provide a method used to detect and correct errors introduced during data storage or transmission. Certain kinds of random access memory (RAM) chips inside a computer implement this technique to correct data errors and are known as ECC memory. ECC memory is used in most computers where data corruption cannot be tolerated under any circumstances, such as for scientific or financial computing and as servers.

Memory errors are proportional to the amount of RAM in a computer as well as the duration of operation. Memory errors are of two types, hard and soft. Fabrication defects in the memory chip cause hard errors, which cannot be corrected once they start appearing. On the other hand, electrical disturbances predominantly cause soft errors. Memory errors that are not corrected immediately can eventually crash a computer.

ECC memory maintains a memory system effectively free from single-bit errors: the data read from each word is always the same as the data that had been written to it, even if a single bit actually stored, or more in some cases, has been flipped to the wrong state. Some non-ECC memory with parity support allows errors to be detected, but not corrected; otherwise errors that may occur are not detected. When a client crashes, it normally does not affect other computers even when it is connected to a network, but when a server crashes it can bring the entire network down with it. Hence, ECC memory is mandatory for servers but optional for clients unless they are used for mission critical applications.

A need exists for an effective mechanism to enable enhanced ECC (Error Correction Codes) redundancy in a computer system. It is desirable to provide such mechanism that enables needed robustness to support enhanced Reliability, Availability, and Serviceability (RAS) features.

SUMMARY OF THE INVENTION

Principal aspects of the present invention are to provide a method, system and computer program product for ECC (Error Correction Codes) redundancy using reconfigurable logic blocks in a computer system. Other important aspects of the present invention are to provide such method, system and computer program product substantially without negative effects and that overcome many of the disadvantages of prior art arrangements.

In brief, a method, system and computer program product are provided for implementing ECC (Error Correction Codes) redundancy using reconfigurable logic blocks in a computer system. When a fail is detected when reading from memory, it is determined if the incorrect data is in the data or the ECC component of the data. When incorrect data is found in the ECC component of the data, and an actionable threshold is not reached, a predetermined Reliability, Availability, and Serviceability (RAS) action is taken. When the actionable threshold is reached with incorrect data identified in the ECC component of the data, an analysis process is performed to determine if the ECC logic is faulty. When a fail in the ECC logic is detected, the identified ECC failed logic is replaced with a spare block of logic.

In accordance with features of the invention, a logic built-in self-test (LBIST) test of the ECC is performed to check for faulty logic.

In accordance with features of the invention, after replacing the identified ECC failed logic another LBIST test is performed to ensure that the new logic works. If the test fails, swapping in spare logic blocks is repeated as needed until new logic that works is found or no additional blocks are available.

In accordance with features of the invention, after the fail is detected, mainline traffic is halted to prevent collisions. After the LBIST test passes ensuring that the new logic works, mainline traffic is allowed to resume.

In accordance with features of the invention, LBIST test advantageously is periodically performed during periods of inactivity to proactively check for bad ECC logic. For example, this periodical ECC testing optionally is performed during calibration routines.

In accordance with features of the invention, the actionable threshold is a selected value greater than or equal to one.

In accordance with features of the invention, the logic built-in self-test (LBIST) test of the ECC logic is used to identify the section of ECC logic that is faulty from the recovery of this data. If the LBIST test passes, the threshold counter is reset and no further action is taken.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and computer program product are provided for implementing ECC (Error Correction Codes) redundancy using reconfigurable logic blocks in a computer system. When a memory failure is detected, checking for a potential fail in ECC logic is performed. When incorrect data is found in the ECC component of the data, and an actionable threshold is not reached, a predetermined Reliability, Availability, and Serviceability (RAS) action is taken. When the actionable threshold is reached with incorrect data identified in the ECC component of the data, an analysis process is performed to determine if the ECC logic is faulty. When a fail in the ECC logic is detected, the identified ECC failed logic is replaced with a spare block of logic.

In accordance with features of the invention, the method, system and computer program product include a logic built-in self-test (LBIST) test that is performed on the ECC logic to check for faulty logic. Another LBIST test is performed on new ECC logic to ensure that the new ECC logic works after replacing the identified ECC failed logic. If the test fails, swapping in spare logic blocks is repeated as needed, until no additional spare ECC logic blocks are available.

Figure 1:
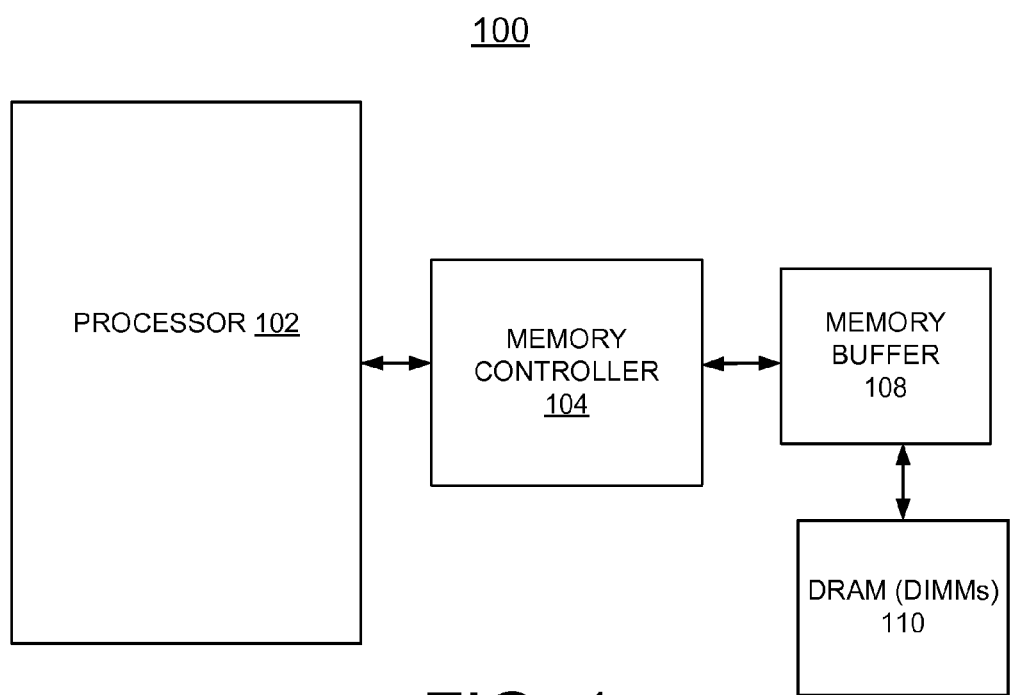
FIGS. 1, 2A and 2B illustrates an example computer system for implementing ECC (Error Correction Codes) redundancy using reconfigurable logic blocks in accordance with preferred embodiments.
Figure 2A:
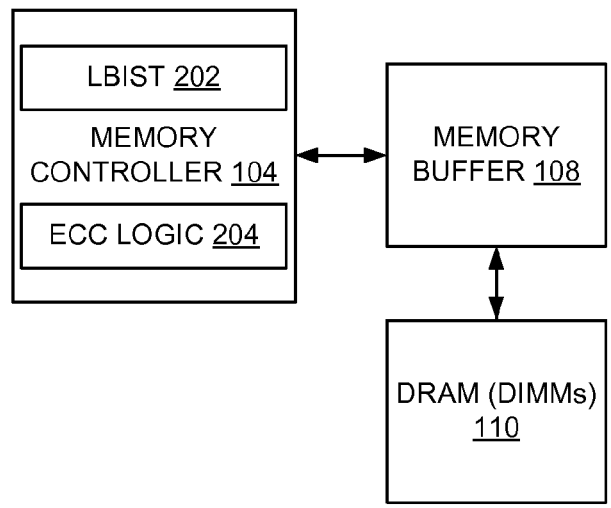
Figure 2B:
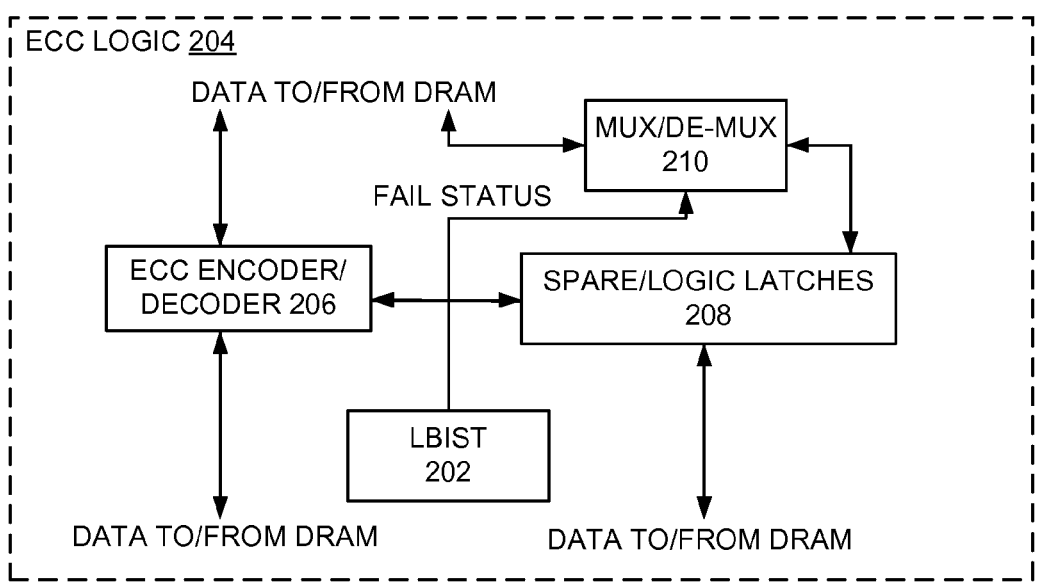

Having reference now to the drawings, in FIGS. 1, 2A, and 2B, there is shown an example computer system generally designated by the reference character 100 for implementing ECC redundancy using reconfigurable logic blocks in accordance with the preferred embodiment.

Computer system 100 includes one or more processors 102 or programmable central processing units (CPUs) 102 including at least one memory controller 104 coupled by a memory buffer 108 to a plurality of Dynamic Random Access Memory (DRAM) modules 110, such as Dual In-line Memory Modules (DIMMs).

As shown in FIGS. 2A, and 2B, the memory controller 104 of computer system 100 includes logic built-in self-test (LBIST) 202 and Error Correcting Codes (ECC) logic 204. The LBIST 202 is used for testing the ECC logic 204 to determine whether an error in the memory subsystem is an ECC logic failure, or otherwise a memory array failure. This determines any possible repair action as well as system functionality.

As shown in FIG. 2B, ECC logic 204 includes an ECC encoder/decoder 206 receiving data to and from the DRAM, a plurality of spare logic/latches 208 receiving data to and from the DRAM and coupled to the ECC encoder/decoder 206 and a multiplexer/de-multiplexer (MUX/DE-MUX) 210 receiving data to and from the DRAM and coupled to the ECC encoder/decoder 206. ECC logic 204 includes LBIST 202 coupled to the MUX/DE-MUX 210, providing a fail status to the MUX/DE-MUX 210.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

Figure 3:
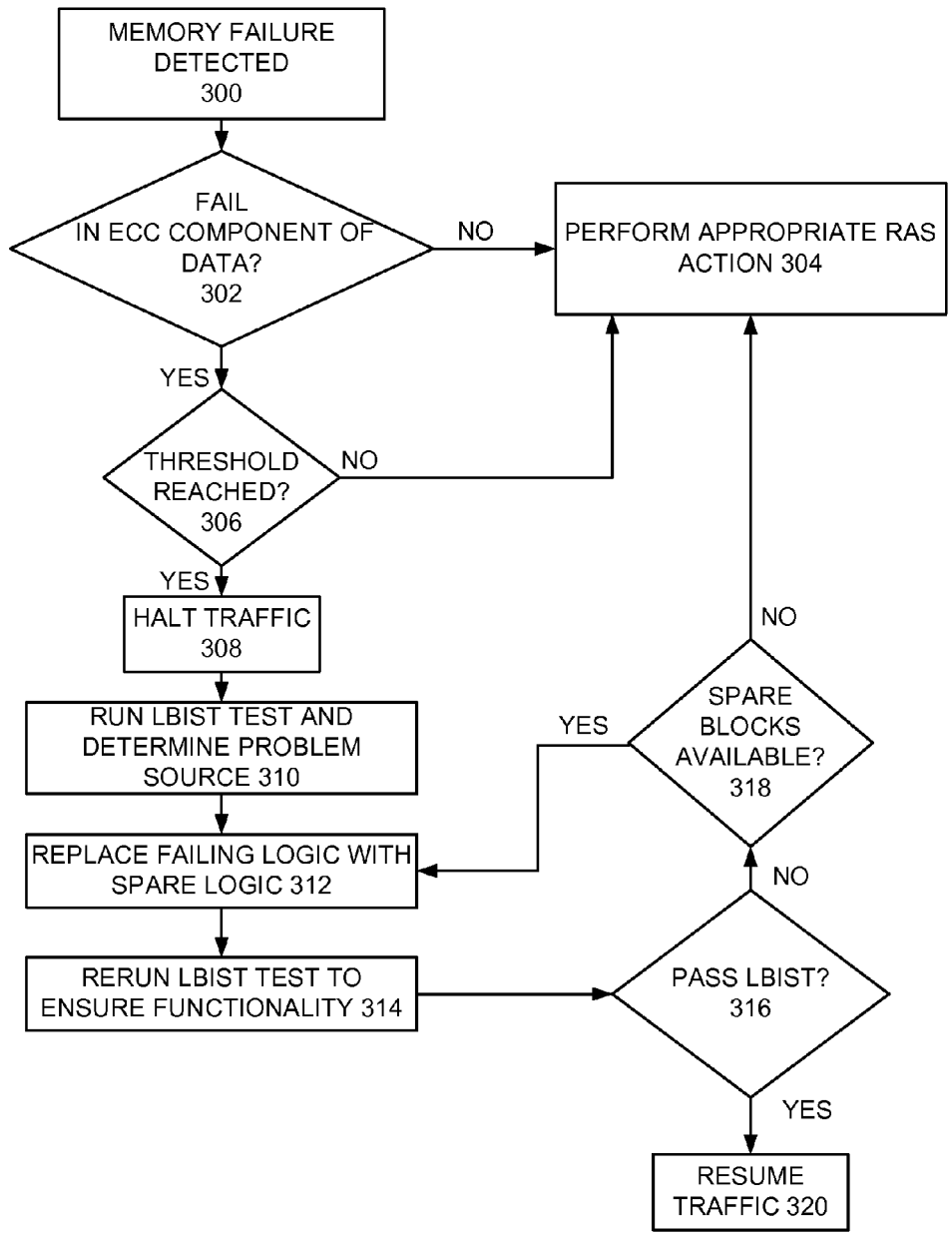
FIG. 3 is a flow chart illustrating exemplary operations for implementing ECC (Error Correction Codes) redundancy methods in the computer system of FIGS. 1, 2A and 2B in accordance with preferred embodiments.

Referring to FIG. 3, there are shown exemplary operations for implementing ECC (Error Correction Codes) redundancy methods in the computer system 100 of FIGS. 1, 2A and 2B in accordance with preferred embodiments. Operations begin with a memory failure detected as indicated in a block 300. When a fail is detected when reading from memory, checking is performed to determine if the incorrect data is in the memory data or the ECC logic. As indicated in a decision block 302, checking is performed to identify a potential fail in the ECC logic. When a potential ECC logic fail is not identified, a predetermined Reliability, Availability, and Serviceability (RAS) action is taken as indicated in a block 314. For example, RAS action includes ECC error correction, retry or reissue reading from memory, testing to identify a bad DRAM location, deploy mask or memory sparing.

When incorrect data is found in the ECC component of the data at decision block 302, checking is performed to identify an actionable threshold as indicated in a decision block 306. When the actionable threshold is not reached, an appropriate RAS action is taken at block 304. When the actionable threshold is reached with incorrect data identified in the ECC logic, an analysis process is performed to determine if the ECC logic is faulty. As indicated in a block 308, traffic is halted to prevent collisions. As indicated in a block 310, LBIST test is run to determine the problem source. The LBIST test at block 310 is periodically performed after traffic is halted at block 308 and during periods of inactivity, such as during to proactively check for bad ECC. The LBIST test at block 310 can identify when a MDI (Memory Domain Indicator) bit that is generally stored in ECC logic, is corrupted or failed. The LBIST test of the ECC logic at block 310 is used to identify the section of ECC logic that is faulty from the recovery of this data. If the LBIST test passes, the threshold counter is reset and no further action is taken.

When a fail in the ECC logic is detected with LBIST test at block 310, the identified ECC failed logic is replaced with a spare block of logic as indicated in a block 312. When the ECC logic fails, the spare logic that is switched into the ECC logic, provides an added reliability advantage for the system 100, for example, which runs the mission critical applications.

After replacing the identified ECC failed logic another LBIST test is performed to ensure that the new logic works as indicated in a block 314, and checking for LBIST test passing is performed as indicated in a decision block 316. If the test fails, checking for spare logic blocks is performed as indicated in a decision block 318. When spare logic blocks are found, swapping in spare logic blocks is repeated at block 312, as needed until new logic that works is found or no additional blocks are available. When the test passes, mainline traffic is allowed to resume as indicated in a block 3420.

Figure 4A:
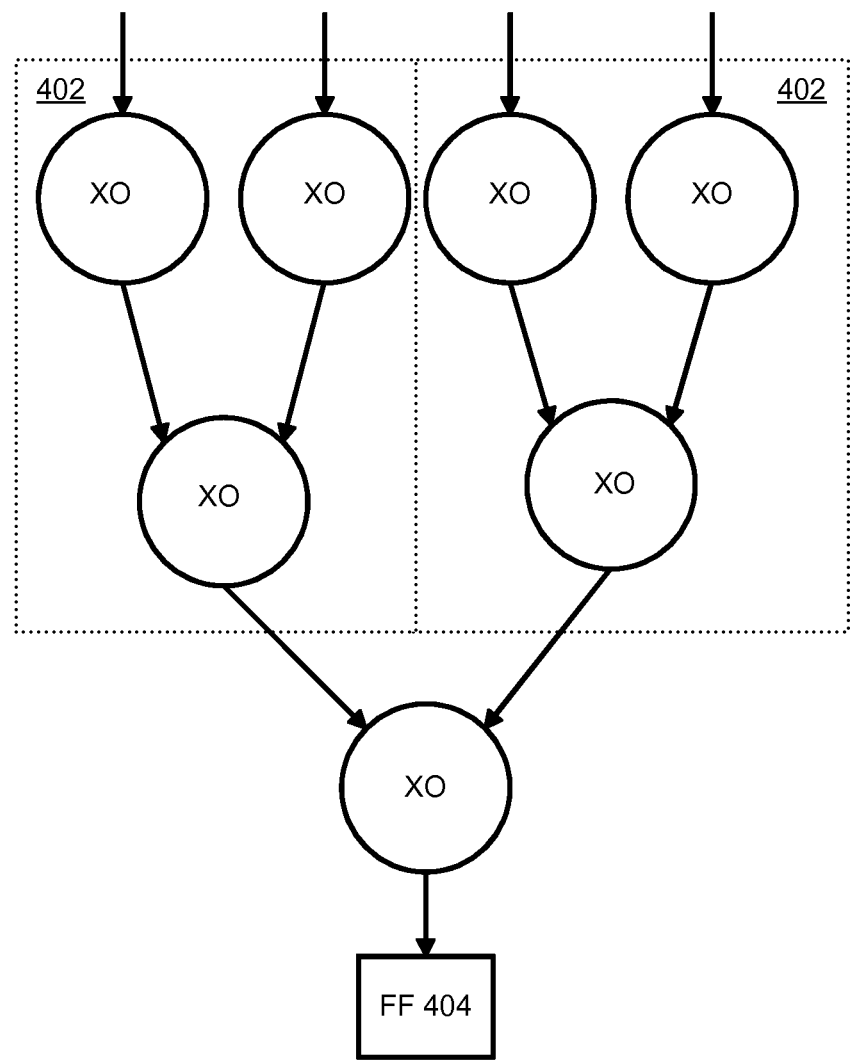
FIGS. 4A and 4B are diagrams illustrating example ECC logic in the example system of FIGS. 1, 2A and 2B in accordance with the preferred embodiment.

Referring to FIG. 4A, there are shown diagrams illustrating ECC logic generally designated by the reference character 400 in the example system 100 of FIGS. 1, 2A and 2B in accordance with the preferred embodiment. ECC logic 400 includes one or more ECC logic sections generally designated by the reference character 402 including a plurality of combinational logic blocks XO, such an including a plurality of exclusive ORs 402, coupled by a combinational logic block XO to an output latch or flip flop (FF) 404.

Figure 4B:
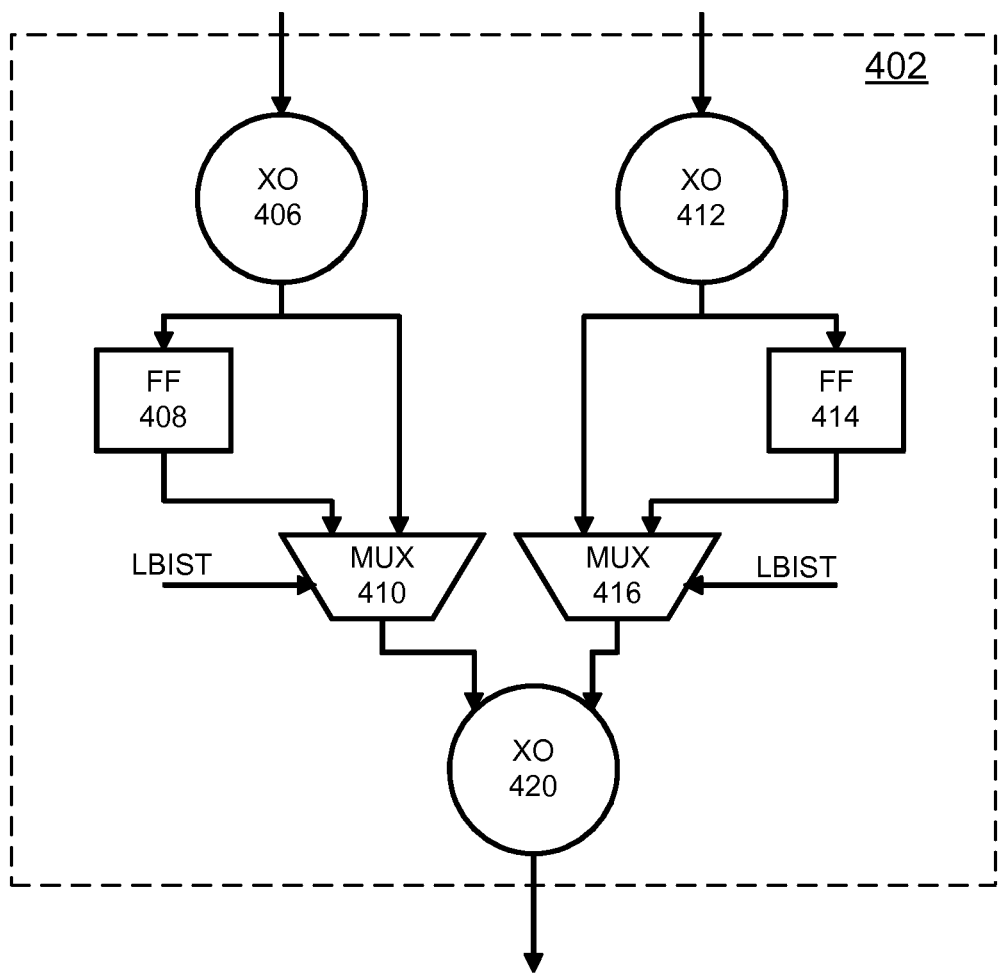

Referring to FIG. 4B, there is shown an example ECC logic section 402 illustrating how LBIST can determine which level of first combinational logic by including additional flip-flops in accordance with the preferred embodiment. ECC logic section 402 includes a first combinational logic block XO, 406 connected to a latch or flip flop (FF) 408. The FF 408 and the combinational logic block XO, 406 are connected to a multiplexer (MUX) 410, which receives an LBIST control input. ECC logic section 402 includes a second combinational logic block XO, 412 connected to a latch or flip flop (FF) 414. The FF 414 and the combinational logic block XO, 412 are connected to a multiplexer (MUX) 416, which receives an LBIST control input. The respective output of MUX 410, 416 is applied to an output combinational logic block XO, 420.

Figure 5:
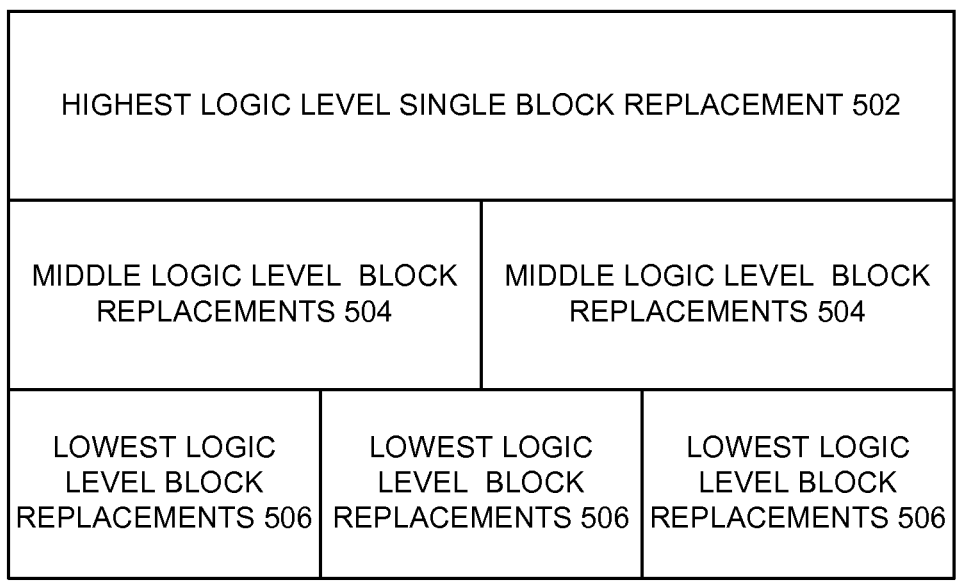
FIG. 5 is a diagram illustrating example ECC replacement logic used in the example system of FIGS. 1, 2A and 2B in accordance with the preferred embodiment.

Referring to FIG. 5, there is shown example ECC replacement logic generally designated by the reference character 500 used in the example system 100 of FIGS. 1, 2A and 2B in accordance with the preferred embodiments. ECC replacement logic 500 includes a highest logic level block replacement 502, for example, used to replace the ECC logic 400. ECC replacement logic 500 includes middle logic level block replacements 504, for example, used to replace the ECC logic 400 or one or more failed sections of the ECC logic 400, such as to replace a failed ECC logic section 402. ECC replacement logic 500 includes lowest logic level block replacements 506, for example, used to replace the ECC logic 400 or one or more failed sections of the ECC logic 400, such as to replace a failed ECC logic section 402 or one of the combinational blocks 406, 412 or 420.

Figure 6:
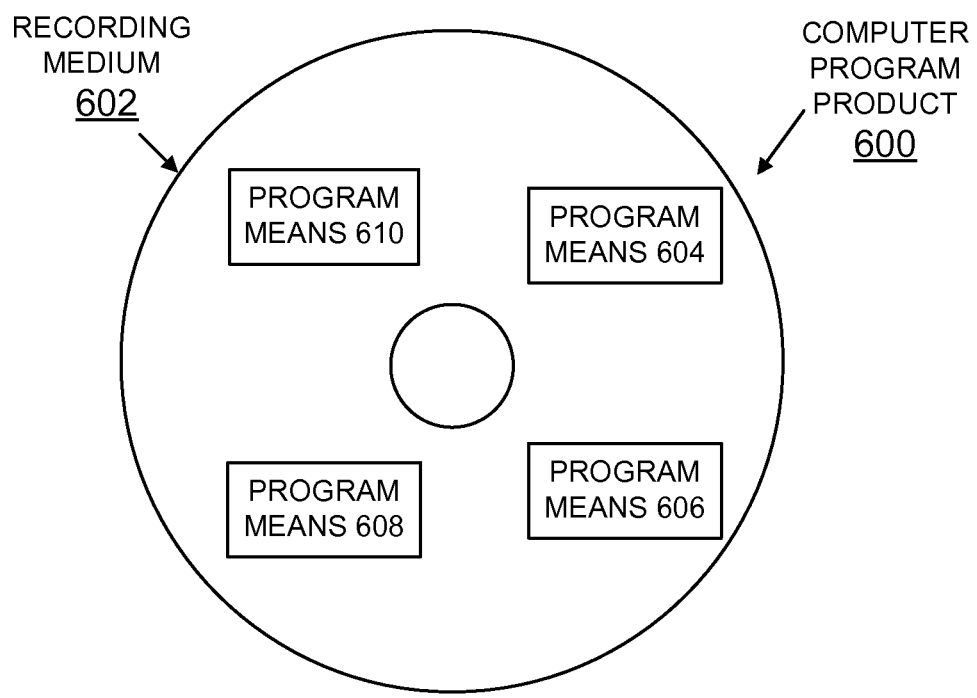
FIG. 6 is a block diagram illustrating a computer program product in accordance with the preferred embodiment.

Referring now to FIG. 6, an article of manufacture or a computer program product 600 of the invention is illustrated. The computer program product 600 is tangibly embodied on a non-transitory computer readable storage medium that includes a recording medium 602, such as, a floppy disk, a high capacity read only memory in the form of an optically read compact disk or CD-ROM, a tape, or another similar computer program product. Recording medium 602 stores program means 604, 606, 608, and 610 on the medium 602 for carrying out the methods for implementing ECC (Error Correction Codes) redundancy using reconfigurable logic blocks of the preferred embodiment in the system 100 of FIGS. 1, 2A and 2B.

A sequence of program instructions or a logical assembly of one or more interrelated modules defined by the recorded program means 604, 606, 608, and 610, direct the computer system 400 for implementing ECC redundancy using reconfigurable logic blocks of the preferred embodiment.

While the present invention has been described with reference to the details of the embodiments of the invention shown in the drawing, these details are not intended to limit the scope of the invention as claimed in the appended claims.

What is claimed is:

1. A method for implementing ECC (Error Correction Codes) redundancy using reconfigurable logic blocks in a computer system comprising:
   responsive to detecting a fail when reading from memory, determining if incorrect data is in the data or the ECC component of the data;
   responsive to the incorrect data being detected in the data or the ECC component of the data, checking for a predefined actionable threshold being reached,
   responsive to said predefined actionable threshold not being reached, performing a predetermined Reliability, Availability, and Serviceability (RAS) action;
   responsive to said predefined actionable threshold being reached and identifying the incorrect data being detected in the ECC component of the data, performing an analysis process to identify faulty ECC logic; and
   responsive to a fail being detected in the ECC logic, halting mainline traffic to prevent collisions, and replacing the identified ECC failed logic with a spare block of logic.

2. The method as recited in claim 1 includes performing a logic built-in self-test (LBIST) test of the ECC logic to check for faulty logic.

3. The method as recited in claim 1 includes performing a logic built-in self-test (LBIST) test responsive to replacing the identified ECC failed logic.

4. The method as recited in claim 3 includes responsive to a LBIST test fail, swapping in another spare logic block.

5. The method as recited in claim 1 includes responsive to replacing the identified ECC failed logic with a spare block of logic, performing a logic built-in self-test (LBIST) test on the spare block of logic and identifying a passing LBIST test, enabling mainline traffic to resume.

6. The method as recited in claim 1 includes periodically performing a logic built-in self-test (LBIST) test during periods of inactivity to check for bad ECC logic.

7. The method as recited in claim 1 wherein said actionable threshold is a selected value greater than or equal to one.

8. The method as recited in claim 1 includes performing a logic built-in self-test (LBIST) test of the ECC logic to identify a faulty section of ECC logic, and responsive to a passing LBIST test, resetting said actionable threshold.

9. A system for implementing ECC (Error Correction Codes) redundancy using reconfigurable logic blocks in a computer system comprising:
   a memory controller, said memory controller comprising ECC logic and logic built-in self-test (LBIST) logic;
   said memory controller responsive to detecting a fail when reading from memory, determining if incorrect data is in the data or the ECC component of the data;
   said memory controller responsive to the incorrect data being detected in the data or the ECC logic, checking for a predefined actionable threshold being reached,
   said memory controller responsive to said predefined actionable threshold not being reached, performing a predetermined Reliability, Availability, and Serviceability (RAS) action;
   said memory controller responsive to said predefined actionable threshold being reached and identifying the incorrect data being detected in the ECC component of the data, performing an analysis process to identify faulty ECC logic; and
   said memory controller responsive to a fail being detected in the ECC logic, halting mainline traffic to prevent collisions, and replacing the identified ECC failed logic with a spare block of logic.

10. The system as recited in claim 9, includes control code stored on a computer readable medium, and wherein said memory controller uses said control code to implement the ECC (Error Correction Codes) redundancy.

11. The system as recited in claim 9 wherein said memory controller performing an analysis process to identify faulty ECC logic includes said memory controller performing a logic built-in self-test (LBIST) test of the ECC logic.

12. The system as recited in claim 9 includes said memory controller performing a logic built-in self-test (LBIST) test responsive to replacing the identified ECC failed logic.

13. The system as recited in claim 12 includes said memory controller responsive to a LBIST test fail, swapping in another spare logic block.

14. The system as recited in claim 9 includes said memory controller responsive to replacing the identified ECC failed logic with a spare block of logic, performing a logic built-in self-test (LBIST) test on the spare block of logic and identifying a passing LBIST test, enabling mainline traffic to resume.

15. The system as recited in claim 9 includes said memory controller selecting said actionable threshold equal to value greater than or equal to one.

16. The system as recited in claim 9 includes said memory controller performing a logic built-in self-test (LBIST) test of the ECC logic to identify a faulty section of ECC logic.

17. The system as recited in claim 16 includes said memory controller responsive to a passing LBIST test, resetting said actionable threshold.

18. The system as recited in claim 9 includes said memory controller periodically performing a logic built-in self-test (LBIST) test during periods of inactivity to check for bad ECC logic.

\* \* \* \* \*